United States Patent [19]

Stepp et al.

[11] 4,423,381

[45] Dec. 27, 1983

[54] PULSE CONTROL CIRCUIT

[75] Inventors: Elvin Stepp, Cincinnati; Gary Claypoole, West Chester, both of Ohio

[73] Assignee: Cincinnati Electronics Corporation, Cincinnati, Ohio

[21] Appl. No.: 225,721

[22] Filed: Jan. 16, 1981

[51] Int. Cl.³ .............................................. H03L 7/18
[52] U.S. Cl. ....................................... 328/14; 377/44; 377/48
[58] Field of Search ....................... 328/14; 377/44, 48

[56] References Cited

U.S. PATENT DOCUMENTS

| 3,949,290 | 4/1976 | McClaskey . | |
| 3,949,304 | 4/1976 | McClaskey . | |
| 3,976,945 | 8/1976 | Cox | 328/14 |
| 3,982,199 | 9/1976 | Green | 328/14 X |
| 4,031,476 | 6/1977 | Goldberg . | |
| 4,077,008 | 2/1978 | Rast et al. . | |
| 4,296,407 | 10/1981 | Minakuchi | 328/14 X |
| 4,316,151 | 2/1982 | Ooms | 328/14 X |
| 4,325,031 | 4/1982 | Ooms et al. | 328/14 X |

Primary Examiner—John S. Heyman
Attorney, Agent, or Firm—Lowe, King, Price & Becker

[57] ABSTRACT

A frequency synthesizer or a circuit for deleting cycles from a wave source includes a dual modulus counter responsive to a reference frequency source of the synthesizer or waves of the source. The dual modulus counter selectively decreases the number of cycles of the source by the factors $K_2$ and $(K_2+1)$. A frequency divider divides the frequency of the source by a third factor L to derive an output wave. The dual modulus counter is activated so it divides by $K_2+1$, whereby the dual modulus counter derives an output signal having a frequency $F_0=F_{in}/K_2(1-1/L)$, where $F_{in}$ equals the frequency of the source, L is an integer and $K_2$ is an integer greater than L.

30 Claims, 3 Drawing Figures

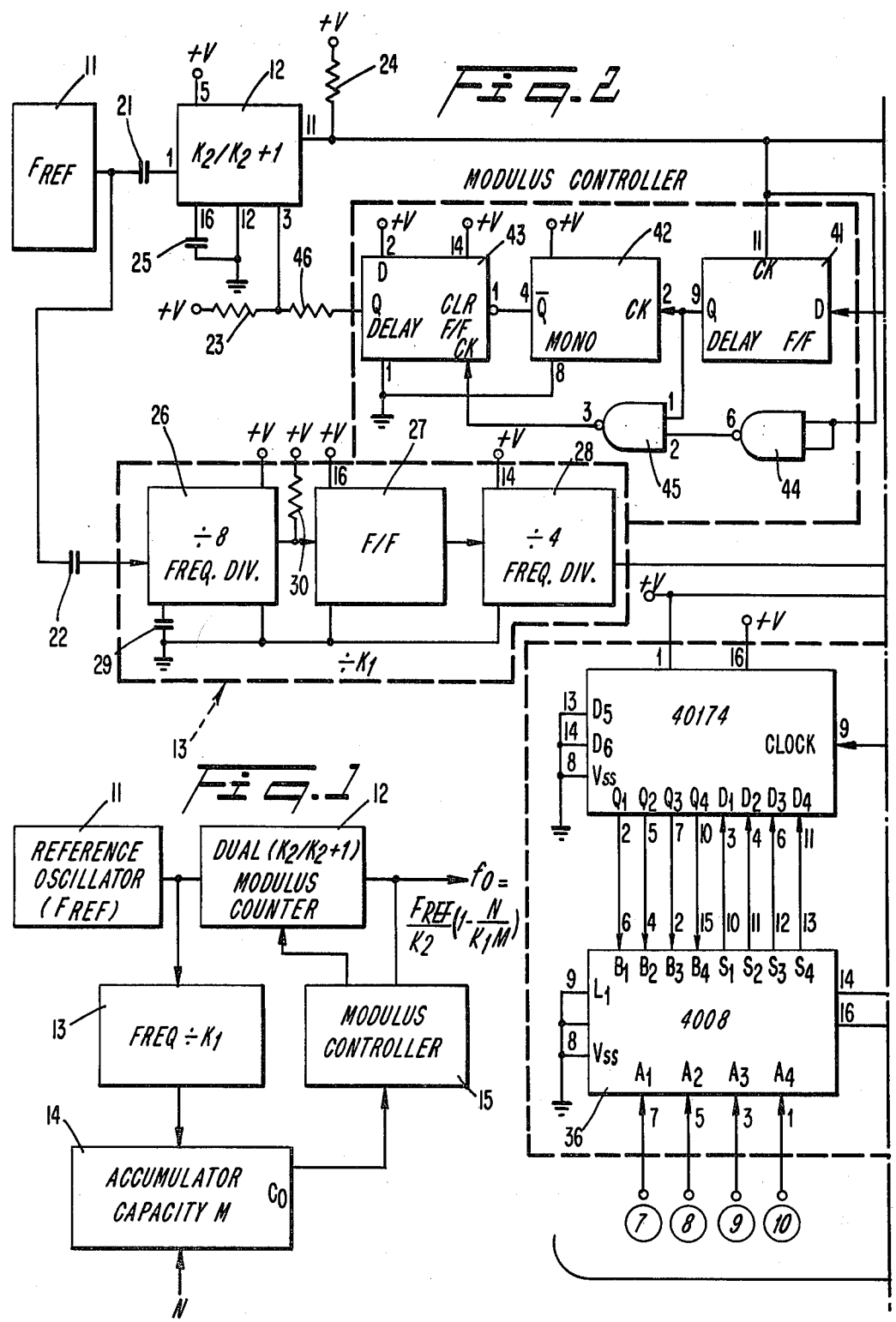

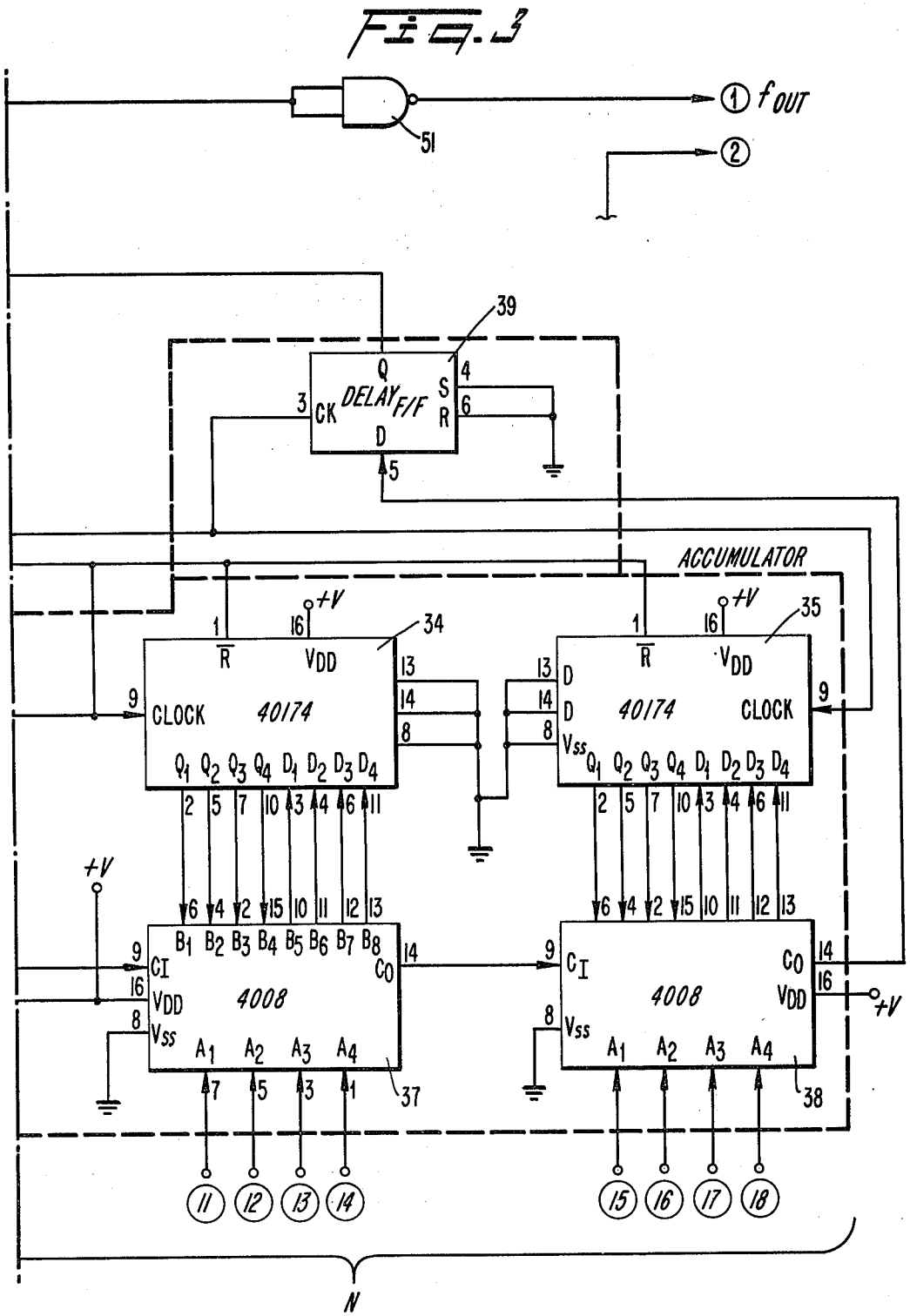

PULSE CONTROL CIRCUIT

TECHNICAL FIELD

The present invention relates generally to pulse control circuits employed in frequency synthesizers and in pulse deleter circuitry and, more particularly, to such circuits wherein a dual modulus counter is employed.

BACKGROUND ART

One prior art frequency synthesizer utilizes a reference frequency oscillator which drives a pulse deleter and a frequency divider in parallel. The frequency divider derives a square wave output having a frequency that is a sub-multiple of the reference frequency, such that the output frequency of the frequency divider is represented as $F_R/K_1$, where $F_R$ equals the frequency of the reference frequency oscillator and $K_1$ is the frequency division factor of the frequency divider. The square wave output of the frequency divider is applied to an accumulator having a maximum capacity of M and which can be set to derive a carry output in accordance with a predetermined input digit N. Thereby, the carry output of the accumulator has a frequency related to the input frequency of the accumulator in accordance with $F_C = F_1 N/M$, where $F_C$ equals the output frequency of the accumulator and $F_1$ equals the input frequency of the accumulator. Thus, the output frequency of the accumulator is represented as $F_C = F_R N/MK_1$. The output frequency of the accumulator is applied as a control input to the pulse deleter, such that for each output of the accumulator one pulse is removed from the wave of the reference frequency oscillator. Thus, the pulse deleter derives an output wave having a frequency $F_D = F_R (1 - N/K_1 M)$. The output of the pulse deleter is applied to a second frequency divider, having a frequency division factor $K_2$. The output frequency of the second frequency divider is thus represented as $F_0 = F_R/K_2 (1 - N/K_1 M)$.

This prior art device thus can be utilized as a digitally controlled synthesized oscillator. Alternatively, the output frequency of the oscillator, $F_0$, is digitally controlled by a suitable source, such as a keyboard, in accordance with the value of N. The prior art circuitry including the pulse deleter, frequency divider circuity and, if required, accumulator circuit can be utilized to selectively delete pulses from a source other than a reference frequency source and in applications other than as a digitally controlled oscillator.

The prior art circuit functions admirably in low frequency situations. However, if the reference frequency oscillator or a pulse source has a very high frequency, such as 100 MHz, it is difficult to provide a pulse deleter capable of reacting in sufficient time to delete one pulse from such a source. The pulse deleter in the prior art device must be able to change state from a non-delete state to a state in which a single pulse from the reference frequency source or the pulse train is deleted and be reset back to the non-delete state within one cycle of the reference frequency source or one pulse of the pulse source. For a 100 MHz source, such changes of state must occur within an interval of ten nanoseconds. Otherwise, the pulse deleter section is not able to delete a single pulse from the source. Presently available pulse deleters employ Schottky transistor transistor logic which have propagation delays in excess of the ten nanosecond period of one cycle of a 100 MHz source. In addition, the propagation delay of the Schottky transistor transistor logic pulse deleters changes as a function of temperature. Thus, unpredictable results occur if the typical prior art devices are employed.

It is, accordingly, an object of the present invention to provide a new and improved frequency synthesizer.

Another object of the invention is to provide a new and improved pulse control circuit.

A further object of the invention is to provide a new and improved digitally controlled frequency synthesizer or pulse control circuit which is capable of accurately handling reference frequencies or pulse sources of the order of 100 MHz.

A further object of the invention is to provide a new and improved digitally controlled synthesizer or pulse control circuit wherein pulses are selectively deleted from a reference frequency source or a pulse source without the requirement of reacting immediately to a single cycle of the source.

An additional object of the invention is to provide a new and improved frequency synthesizer responsive to a reference frequency source or a pulse deleter circuit wherein a single cycle of the source is selectively removed from a series of cycles of the source, but wherein many cycles of the source can be used by a circuit to remove the single cycle.

DISCLOSURE OF THE INVENTION

In accordance with one aspect of the invention a circuit is provided for deleting cycles from a wave source, such as a reference frequency source or a pulse source. The circuit includes a dual modulus counter responsive to the source. The counter is selectively activated to first and second states for decreasing the number of cycles of the wave source by first and second factors, respectively. A frequency divider means responds to the source to reduce the number of cycles of the wave source by a third factor to derive a control signal. The control signal has an output frequency that is a sub-multiple of the frequency of the source. Circuit means responds to the control source for controlling when the dual modulus counter is activated to have the first and second factors as a function of transitions of the control signal. The occurrence times of the transitions are determined by the output frequency of the control signal. In a preferred embodiment, the frequency divider means includes a frequency division factor $K_1$ and an accumulator, having a carry output with an output frequency equal to a sub-multiple of its input frequency in accordance with N/M, where M is the capacity of the accumulator and N is an integer supplied to the accumulator and which is equal to or less than M. In the preferred embodiment, the dual modulus counter selectively injects frequency division factors of $K_2$ and $K_2 + 1$ onto the waves of the source, which can either be a reference frequency oscillator or a pulse source. In the preferred embodiment, the control means for the dual modulus counter causes the dual modulus counter to be activated to the $K_2 + 1$ state until a cycle of the dual modulus counter has been completed. Thus, the output of the dual modulus counter has an output frequency $F_0 = F_R/K_2 (1 - N/K_1 M)$, the same relationship which exists for the output frequency of the prior art device.

Stated differently, the invention is directed to a circuit for deleting cycles from a wave source wherein a dual modulus counter responds to the source and is selectively actuated to first and second states for decreasing the number of cycles of the wave source by a first factor $K_2$ and a second factor $K_2+N$, respectively. A frequency divider responds to the source to divide the frequency of a wave of the source by a third factor L to derive an output wave. Control circuitry is provided to activate the dual modulus counter to the second state once during each cycle of the output wave and to return the dual modulus counter to the first state after N cycles of the source have been coupled through the dual modulus counter while the dual modulus counter is in the second state. In the preferred embodiment, N is an integer less than $K_2$ or L. Also in the preferred embodiment, $L=K_1M/N$, a result achieved by cascading a frequency divider having a frequency division factor of $K_1$ with an accumulator having a capacity of M and a digitally set input N.

The present invention thus uses the dual modulus counter in an unorthodox manner. Advantage is taken of the fact that, in order to increase the modulus of the dual modulus counter by one, the dual modulus counter in effect must delete a cycle from the reference frequency source or a pulse from the pulse source. The reason why a dual modulus counter can be employed in this manner is because the oscillator or pulse deletion circuit of the present invention requires an additional frequency division factor of $K_2$ following pulse deletion. Thus, an important aspect of the invention is the recognition of the fact that the dual modulus counter can perform the pulse deleter function and the divide by $K_2$ function together. While the dual function of the dual modulus counter enables the number of components to be reduced, the most important and subtle reason for using the dual modulus counter is the ability of the dual modulus counter to change state from a division factor of $K_2$ to $K_2+1$ over several cycles of a high frequency (100 MHZ or above) wave source while effectively removing a single cycle from the source. Because the present invention employs the pulse deleter with the frequency divider, the set-up time required between the command to delete a pulse and activation of the circuit which deletes the pulse, i.e., the dual modulus counter, is performed within the dual modulus counter. Thus, the set-up time is reduced by a factor equal to the length of the dual modulus counter. In a typical situation, the dual modulus counter has a length of ten, i.e., $K_2=10$. In one particular embodiment of the dual modulus counter, i.e., pulse swallow counter, the time available for the counter to be set from the frequency division factor to another is up to seventy percent of the period of the output signal of the counter. This has the effect of reducing the critical timing requirements for swallowing a single cycle or pulse of the source by the frequency division factor $K_2$ of the dual modulus counter. Thus, the speed at which state of the art circuitry limits the upper limit of the reference frequency or the frequency of a pulse source is increased by a factor of $K_2$.

It is, accordingly, still another object of the present invention to provide a digital frequency synthesizer or a digital pulse deletion circuit wherein pulses are deleted from an input source with a device that can be activated to a pulse deletion mode over several cycles of the source.

The above and still further objects, features and advantages of the present invention will become apparent upon consideration of the following detailed description of one specific embodiment thereof, especially when taken in conjunction with the accompanying drawings.

BRIEF DESCRIPTION OF THE DRAWINGS

FIG. 1 is a block diagram of a preferred embodiment of the invention; and

FIG. 2 is a detailed circuit diagram of the apparatus illustrated in FIG. 1.

BEST MODE FOR CARRYING OUT THE INVENTION

Reference is now made to FIG. 1 of the drawing wherein there is illustrated a reference frequency oscillator having a relatively high frequency, such as 100 MHZ, such as derived from a low power sinusoidal crystal oscillator. A reference oscillator, such as a crystal oscillator, is employed when the invention is utilized as a digitally controlled frequency synthesizer. If, however, the invention is employed as a device for eliminating pulses from a source, reference frequency oscillator 11 is replaced by the source, which can be a pulse source or any other suitable wave source.

The output of source 11 is applied in parallel to dual modulus counter 12 and to fixed frequency divider 13. Dual modulus counter 12 has a frequency division factor of $K_2$ or $K_2+1$, where $K_2$ is typically ten. Fixed frequency divider 13 has a frequency division factor $K_1$, in one preferred embodiment equal to thirty-two.

Frequency divider 13 derives a square wave output which is applied to one input of accumulator 14, having a capacity M. Accumulator 14 includes a digital input having a value N which is not greater than M. Digital input N of accumulator 14, in combination with capacity M of the accumulator, determines the frequency of an output of the accumulator from carry $C_0$ output of the accumulator. Thus, the output frequency of accumulator 14 is related to the input frequency of the accumulator in accordance with $F_C=F_1N/M$. The output frequency of accumulator 14 is thus related to the frequency, $F_R$, of source 11 in accordance with $F_C=F_RL$, where $L=N/K_1M$, where N is equal to or less than M.

Accumulator 14 derives a square wave output which is applied as a control input to modulus controller 15 for dual modulus counter 12. Modulus controller 15 is also responsive to the output of counter 12. Modulus controller 15 responds to the leading positive going edge of each cycle of the output of accumulator 14 to change the frequency division factor of counter 12 from $K_2$ to $K_2+1$. Controller 15 responds to the subsequent positive going edge of the output of counter 12 to change the state of the counter from a frequency division factor of $K_2+1$ back to a frequency division factor of $K_2$. Thus, dual modulus counter 12 responds to the output signal of modulus controller 15 to delete waves from reference oscillator 11, whereby the output frequency of counter 12 is related to the input frequency of the counter in accordance with:

$$F_0=F_R/K_2(1-N/L),$$

where $L=N/K_1M$.

If the device is utilized as a pulse deleter, rather than as a digitally controlled oscillator, accumulator 14 can be eliminated and L can be provided exclusively by frequency divider 13.

A preferred embodiment of the invention employs a Plessey SP 8690 for dual modulus counter 12. Such a dual modulus counter is advantageous because it can respond to a sinusoidal output of reference frequency oscillator 11. It is advantageous for reference frequency oscillator 11 to be a sinusoidal source, such as a crystal oscillator, because such as source consumes very low power levels. More importantly, however, several cycles of source 11 can propagate through the Plessey SP 8690 dual modulus counter while the modulus of the counter changes from ten to eleven; the present invention uses this feature to effectively delete a single cycle from source 11. Thus, the critical timing to delete a single cycle with the present invention is several cycles of source 11, instead of a fraction of a single cycle, as is the case with the prior art. Recognition of the fact that dual modulus counter 12 can act as a pulse deleter and as a fixed frequency divider, while reducing the critical timing of cycles deleted from source 11 by a factor equal to the modulus $K_2$ of counter 12, is an essential aspect of the invention.

Reference is now made to FIG. 2 of the drawing wherein there is illustrated a detailed circuit diagram of the apparatus illustrated in FIG. 1. Reference frequency, sinusoidal source 11, having an output frequency of 100 MHZ or above, or a similar type pulse source, drives dual modulus counter 12 and frequency divider 13 in parallel by way of DC isolating, AC coupling capacitors 21 and 22, respectively. In the preferred embodiment, as indicated supra, dual modulus counter 12 is a Plessey SP 8690 integrated circuit chip having a clock input terminal 1 and an output terminal 11 on which is derived a square wave that is a submultiple by a factor of ten or eleven of the sinusoidal wave applied to input terminal 1 of the dual modulus counter. To provide the dual modulus function, counter 12 includes an input terminal 3 which is responsive to a bi-level signal. In response to the bi-level signal applied to terminal 3 respectively having high and low values, the fequency division factors of counter 12 are eleven and ten. Appropriate bias is applied to terminals 3, 5, 11, 12 and 16 of counter 12 by a positive DC supply terminal and a ground terminal, such that the positive supply terminal is connected to terminals 3 and 11 of counter 12 via resistors 23 and 24, respectively, the positive DC voltage is directly connected to terminal 5 of the counter, terminal 12 of the counter is grounded, and terminal 16 of the counter is connected to ground through capacitor 25.

In a preferred embodiment, frequency divider 13 provides a frequency division factor of thirty-two. Thereby, the sinusoidal output of reference frequency source 11 is translated in frequency and wave shape by divider 13 into a square wave having a frequency that is 1/32 of the frequency of source 11. To these ends, frequency divider 13 includes cascaded divide by eight frequency divider chip 26, amplifier chip 27 and divide by four divider chip 28. In the preferred embodiment, chips 26, 27 and 28 are types 8794, 74190 and CD4024, respectively. Positive DC bias voltages are supplied to terminals 1, 16 and 14 of chips 26, 27 and 28. Terminal 5 of chip 26 is grounded. Terminals 1, 5, 8, 9, 10 and 15 of chip 27 are grounded and terminals 2 and 7 of chip 28 are grounded. Terminal 8 of chip 26 is connected to ground by way of capacitor 29. Output terminal 3 of chip 26 is connected directly to input terminal 14 of chip 27, with suitable bias being provided by resistor 30, connected to the positive DC supply voltage. Output terminal 13 of chip 27 is directly connected to input terminal 1 of chip 28.

The square wave output derived at output terminal 11 of chip 28 is applied as an input to accumulator 14, having an output terminal $C_0$ on which is derived a square wave having a frequency N/M times the output frequency of the square wave derived from counter 13, where N is less than or equal to M and M is the capacity of accumulator 14. In the preferred embodiment, accumulator 14 includes 3 storage chips 33, 34 and 35, each capable of storing four bits, as well as three four-bit full adders 36, 37 and 38. In the preferred embodiment, each of chips 33, 34 and 35 is a type 40174, while each of chips 36, 37 and 38 is a type 4008. Each of chips 33, 34 and 35 includes four data input terminals $D_1$–$D_4$ and four data output terminals $Q_1$–$Q_4$, as well as bias terminals $V_{DD}$ and $C_{SS}$ and a control input terminal R. Terminal $V_{SS}$, as well as two additional data terminals, $D_5$ and $D_6$, are connected to ground, while terminal $V_{DD}$ and control terminal R are connected to positive DC voltage sources, to establish appropriate bias for chips 33, 34 and 35. Clock input terminals (CK) of chips 33, 34 and 35 are driven in parallel by the output of frequency divider 13, as derived from output terminal 11 of chip 28. Input terminals $D_1$–$D_4$ of chips 33–35 are responsive to signals at output terminals $S_1$–$S_4$ of chips 36, 37 and 38, respectively. Output terminals $Q_1$–$Q_4$ of chips 33–35 are connected to input terminals $B_1$–$B_4$ of chips 36, 37 and 38, respectively. Chips 36, 37 and 38 also include input terminals $A_1$–$A_4$, such that each of input terminals $A_1$–$A_4$ is responsive to a different bit of a twelve-bit binary signal representing the value of N. Each of chips 36, 37 and 38 includes a carry output terminal $C_0$ on which is derived a binary one level in response to a carry occurring in the most significant bit position of each respective full adder. Terminals $C_0$ of chips 36 and 37 are directly applied to input terminals $C_I$ of chips 37 and 38, while output terminal $C_0$ of chip 38 is applied to input terminal D of delay flip-flop 39, having a clock input terminal 3 connected to output terminal 11 of chip 28. Delay flip-flop 39 includes set (S) and reset (R) input terminals which are grounded and an output terminal Q which is applied to a control input terminal of modulus controller 15.

Accumulator 14 is thus a CMOS accumulator that is cascadable in multiples of M bits. Accumulator 14 accumulates the value of input word N each time the accumulator is clocked. The carry output at terminal $C_0$ of chip 28 indicates when a pulse deletion is to be made. Delay flip-flop 39 reclocks the carry output at terminal $C_0$ of chip 38 to eliminate any interference which may occur due to internal delays within accumulator 14.

To these ends, the signals applied to inputs $D_1$–$D_4$ of chips 33, 34 and 35 are read into storage circuits of the chips in response to the leading positive going edge of the signal at output terminal 11 of frequency divider 28. The stored values are maintained in chips 33–35 until the chips are supplied again with a positive going output of chip 28. Thus, the signals derived at terminals $Q_1$–$Q_4$ of chips 33–35 remain constant at the stored values supplied to the chips over the interval between adjacent positive going outputs of chip 28.

Each of four-bit full adders 36–38 includes internal circuitry such that like ordered values of the signals applied to terminals $A_1$–$A_4$ and to terminals $B_1$–$B_4$ are combined in accordance with $S_k = A_k \oplus B_k \oplus C_{k-1}$, where k is selectively each of one, two, three and four, and $C_{k-1}$ is the carry value from the previous stage within the adder or from the highest numbered stage of adder chips 36 and 37, for the first stage of each adder chip 37 and 38; in the first stage of adder 36, $C_{k-1}$ is always zero.

In the preferred embodiment, modulus controller 15 includes delay flip-flop 41, monostable multivibrator 42, delay flip-flop 43, as well as NAND gates 44 and 45. Input terminal D of delay flip-flop 41 is directly connected to output terminal Q of flip-flop 39. Delay flip-flop 43 includes a Q output terminal on which is derived a signal that is coupled to input terminal 3 of dual modulus counter 12 via resistor 46. NAND gate 44 is connected as an inverter responsive to the signal at output terminal 11 of dual modulus counter 12, which signal is also applied in parallel to clock (CK) input terminal of delay flip-flop 41. Output terminal Q of flip-flop 41 is applied in parallel to input terminal 2 of monostable multivibrator 42 and to one input terminal of NAND gate 45, having a second input responsive to the signal at output terminal 6 of NAND gate 44. Output terminal 3 of NAND gate 45 is applied to a clock (CK) input terminal of flip-flop 43, having an inverting clear (CLR) input terminal directly connected to the complementary (Q) output of monostable multivibrator 42. Input terminals 2(D) and 14 of flip-flop 43 are connected to a positive DC bias source, as are terminals 3 and 16 of monostable multivibrator 42. Terminals 1 and 8 of monostable multivibrator 42 and terminal 1 of delay flip-flop 43 are grounded. Similar connections exist for delay flip-flops 41 and 39 as for flip-flop 43, to provide suitable bias.

A delete command signal, in the form of a binary one or high logic signal at output terminal Q of flip-flop 39 can occur at any time. Because of the relatively random nature with which such a delete command signal can be derived from flip-flop 39, such a command signal is clocked into input terminal D of flip-flop 41 under the control of the signal derived from output terminal 11 of dual modulus counter 12. In response to the positive going transition at the Q output of flip-flop 39, there is a corresponding positive going transition at output Q of flip-flop 41. The positive going transition at output Q of flip-flop 41 triggers monostable multivibrator 42 to derive a negative going transition at output terminal Q thereof. The negative going transition at output terminal Q of monostable multivibrator 42 clears flip-flop 43, to provide a negative transition at output terminal Q of delay flip-flop 43. The negative going transition at output terminal Q of flip-flop 43 commands dual modulus counter 12 to divide by a factor of eleven, instead of a factor of ten, as occurred prior to the negative going transition at output terminal Q of flip-flop 43. In response to the next positive going edge of the signal at output terminal 11 of counter 12, as inverted by gate 44 and gated through NAND gate 45, flip-flop 43 clocks the Q output of delay flip-flop 43 back to a high state. A high state at the Q output terminal of flip-flop 43 is coupled to input terminal 3 of counter 12, causing counter 12 to resume frequency division by a factor of ten, instead of a factor of eleven.

The action of modulus controller 15 on dual modulus counter 12 is such that the modulus controller and dual modulus counter are responsive only to the positive going transition of a delete command signal from output terminal Q of flip-flop 39. Modulus controller 15 only commands dual modulus counter 12 to divide by eleven one time after the positive going transition at output terminal Q of flip-flop 39 because of the feedback connection from the output of the dual modulus counter to the modulus controller. If the delete signal at output terminal Q of flip-flop 39 remains in a high state, modulus controller 15 forces dual modulus counter 12 to again have a frequency division factor of ten after it has been provided with a frequency division factor of eleven immediately after one cycle of the divide by eleven operation has occurred. The delete signal at output terminal Q of flip-flop 39 must return to a low or binary zero value and have another positive going transition to establish another divide by eleven factor in counter 12.

To provide necessary gain for the output signal of dual modulus counter 12, the modulus counter output is coupled to an inverter amplifier 51, in the form of a NAND gate.

While there has been described and illustrated one specific embodiment of the invention, it will be clear that variations in the details of the embodiment specifically illustrate and described may be made without departing from the true spirit and scope of the invention as defined in the appended claims.

We claim:

1. A circuit for deleting cycles from a wave source or for synthesizing a frequency in response to a reference oscillator source comprising a dual modulus counter responsive to the source, said dual modulus counter having first and second states for selectively decreasing the number of cycles of the wave source by first and second factors, respectively, means responsive to the source for reducing the number of cycles of the wave source by a third factor to derive a control signal having an output frequency that is a sub-multiple of the frequency of the source, and means responsive to the control signal for controlling when the dual modulus counter is activated to have the first and second factors as a function of the time of a transition of the control signal, wherein occurrence times of said transitions are determined by the output frequency of the control signal.

2. The circuit of claim 1 wherein the means for reducing the number of the cycles by the third factor includes accumulator means for deriving an output wave having a frequency N/M of an input wave thereof, where M is the number of stages of the accumulator means and N is an integer indicative of the number of stages of the accumulator means set to a predetermined state.

3. The circuit of claim 2 wherein the means for reducing the number of the cycles by the third factor includes fixed frequency divider means cascaded with the accumulator means.

4. The circuit of claim 3 wherein the accumulator means is responsive to the fixed frequency divider means and the means for controlling includes flip-flop means clocked by an output of the fixed frequency divider means to be activated by an output of the accumulator means to a first state and activated to a second state by an output of the dual modulus counter, the first and second states of the means for controlling respectively corresponding to the second and first factors of the dual modulus counter.

5. The circuit of claim 1 wherein the means for controlling includes means activated by the control signal to a first state and activated by an output of the dual modulus counter to a second state, the first and second states of the means for controlling respectively corresponding to the second and first factors of the dual modulus counter.

6. The circuit of claim 1 wherein the means for reducing the number of cycles of the wave source and the dual modulus counter are in separate paths responsive to the source.

7. A circuit for deleting cycles from a wave source or for synthesizing a frequency in response to a reference oscillator source comprising a dual modulus counter responsive to the source, said dual modulus counter having first and second states for selectively decreasing the number of cycles of the wave source by a first factor $K_2$ and a second factor $K_2+1$, respectively, frequency divider means responsive to the source for dividing the frequency of the wave of the source by a third factor L to derive an output wave, means for activating the dual modulus counter to the second state once during each cycle of the output wave and for returning the dual modulus counter to the first state in response to one cycle of the dual modulus counter having been completed while the dual modulus counter is in the second state, whereby the dual modulus counter derives an output signal having a frequency $F_0 = F_{in}/K_2(1-1/L)$, where $F_{in}$ equals the frequency of the source, L is an integer and $K_2$ is an integer greater than L.

8. The circuit of claim 7 wherein the frequency divider means and the dual modulus counter are in separate paths responsive to the source.

9. The circuit of claim 6 wherein the frequency divider means includes accumulator means for deriving an output wave having a frequency N/M of an input wave thereof, where M is the number of stages of the accumulator means and N is an integer indicative of the number of stages of the accumulator means set to a predetermined state.

10. The circuit of claim 9 wherein the frequency divider means includes fixed frequency divider means having a frequency division factor $K_1$ cascaded with the accumulator means, whereby $L=K_1M/N$.

11. The circuit of claim 10 wherein the accumulator means is responsive to the fixed frequency divider means and the means for controlling includes flip-flop means clocked by an output of the fixed frequency divider means to be activated by an output of the accumulator means to a first state and activated to a second state by an output of the dual modulus counter, the first and second states of the means for controlling respectively corresponding to the second and first factors of the dual modulus counter.

12. The circuit of claim 7 wherein the means for controlling includes flip-flop means activated by the control signal to a first state and activated by an output of the dual modulus counter to a second state, the first and second states of the means for controlling respectively corresponding to the second and first factors of the dual modulus counter.

13. A circuit for deleting cycles from a wave source or for synthesizing a frequency in response to a reference oscillator source comprising a dual modulus counter responsive to the source, said dual modulus counter having first and second states for selectively decreasing the number of cycles of the wave source by a first factor $K_2$ and a second factor $K_2+N$, respectively, frequency divider means responsive to the source for dividing the frequency of the waves of the source by a third factor L to derive an output wave, means for activating the dual modulus counter to the second state once during each cycle of the output wave and for returning the dual modulus counter to the first state in response to N cycles being derived from the dual modulus counter while the dual modulus counter is in the second state, where:

N is an integer less than L or $K_2$,
L is an integer, and
$K_2$ is an integer greater than L.

14. The circuit of claim 13 wherein the frequency divider means and the dual modulus counter are in separate paths responsive to the source.

15. The circuit of claim 13 wherein the frequency divider means includes accumulator means for deriving an output wave having a frequency N/M of an input wave thereof, where M is the number of stages of the accumulator means and N is an integer indicative of the number of stages of the accumulator means set to a predetermined state.

16. The circuit of claim 15 wherein the frequency divider means includes fixed frequency divider means having a frequency division factor $K_1$ cascaded with the accumulator means, whereby $L=K_1M/N$.

17. The circuit of claim 16 wherein the accumulator means is responsive to the fixed frequency divider means and the means for controlling includes flip-flop means clocked by an output of the fixed frequency divider means to be activated by an output of the accumulator means to a first state and activated to a second state by an output of the dual modulus counter, the first and second states of the means for controlling respectively corresponding to the second and first factors of the dual modulus counter.

18. The circuit of claim 13 wherein the means for controlling includes flip-flop means activated by the control signal to a first state and activated by an output of the dual modulus counter to a second state, the first and second states of the means for controlling respectively corresponding to the second and first factors of the dual modulus counter.

19. A circuit for deleting cycles from a wave source or for synthesizing a frequency in response to a reference oscillator source comprising a dual modulus counter responsive to the source, said dual modulus counter having first and second states for selectively decreasing the number of cycles of the wave source by first and second factors, respectively, the dual modulus counter deriving an output wave, means responsive to the source for reducing the number of cycles of the wave source by a third factor to derive a control signal having an output frequency that is a sub-multiple of the frequency of the source, and means responsive to the control signal and the output wave for controlling when the dual modulus counter is activated to have the first and second factors as a function of the times of transitions of the control signal and the output wave, wherein occurrence times of said transitions are determined by the output frequency of the control signal.

20. The circuit of claim 19 wherein the means for reducing the number of cycles of the wave source and the dual modulus counter are in separate paths responsive to the source.

21. The circuit of claim 19 wherein the means for reducing the number of the cycles by the third factor includes accumulator means for deriving an output wave having a frequency N/M of an input wave thereof, where M is the number of stages of the accumulator means and N is an integer associated with an output frequency of the synthesizer and indicative of the number of stages of the accumulator means set to a predetermined state.

22. The circuit of claim 21 wherein the means for reducing the number of the cycles by the third factor includes fixed frequency divider means cascaded with the accumulator means.

23. The circuit of claim 22 wherein the accumulator means is responsive to the fixed frequency divider means and the means for controlling includes flip-flop means clocked by an output of the fixed frequency divider means to be activated by an output of the accumulator means for a first state and activated to a second state by an output of the dual modulus counter, the first and second states of the means for controlling respectively corresponding to the second and first factors of the dual modulus counter.

24. The circuit of claim 19 wherein the means for controlling includes flip-flop means activated by the control signal to a first state and activated by an output of the dual modulus counter to a second state, the first and second states of the means for controlling respectively corresponding to the second and first factors of the dual modulus counter.

25. A circuit for eliminating pulses from a pulse source or for deriving a synthesized output wave in response to a reference oscillator source comprising a dual modulus counter having a control input, another input responsive to the source and an output for deriving an output wave, the output wave having output frequencies equal to $F_R/K_2$ and $F_R/(K_2+L)$ in response to the control input respectively responding to first and second values, where: $F_R$ is the frequency applied to the control input, $K_2$ is a positive integer, and L is a positive integer; the frequency of $F_R$ and the dual modulus counter being such that several cycles of $F_R$ propagate through the dual modulus counter while the dual modulus counter changes between the frequency division factors of $K_2$ and $(K_2+L)$, frequency divider means responsive to the source for deriving a wave having a frequency of $F_R/K$, where K is a positive integer, and means for controlling the modulus of the dual modulus counter responsive to the wave having a frequency of $F_R/K$ and the output wave of the dual modulus counter for applying one of the values to the control input in response to a transition of predetermined polarity in the wave having a frequency of $F_R/K$ and for applying the other value to the control input in response to the first transition of a specified polarity of the output wave following said predetermined polarity transition in the wave having a frequency of $R_R/K$.

26. The circuit of claim 25 wherein the frequency divider means and the dual modulus counter are in separate paths responsive to the source.

27. The circuit of claim 25 wherein the frequency divider means includes accumulator means for deriving an output wave having a frequency N/M of an input wave thereof, where M is the number of stages of the accumulator means and N is an integer associated with an output frequency of the synthesizer and indicative of the number of stages of the accumulator means set to a predetermined state.

28. The circuit of claim 27 wherein the frequency divider means includes fixed frequency divider means having a frequency division factor $K_1$ cascaded with the accumulator means, whereby $L=K_1M/N$.

29. The circuit of claim 28 wherein the accumulator means is responsive to the fixed frequency divider means and the means for controlling includes flip-flop means clocked by an output of the fixed frequency divider means to be activated by an output of the accumulator means to a first state and activated to a second state by an output of the dual modulus counter, the first and second stages of the means for controlling respectively corresponding to the second and first factors of the dual modulus counter.

30. The circuit of claim 25 wherein the means for controlling includes flip-flop means activated by the control signal to a first state and activated by an output of the dual modulus counter to a second state, the first and second states of the means for controlling respectively corresponding to the second and first factors of the dual modulus counter.

* * * * *